(12) United States Patent
Bodenhausen et al.

(10) Patent No.: US 7,626,386 B2
(45) Date of Patent: Dec. 1, 2009

(54) SINGLET-STATE EXCHANGE NMR SPECTROSCOPY FOR THE STUDY OF VERY SLOW DYNAMIC PROCESSES

(75) Inventors: Geoffrey Bodenhausen, Paris (FR); Paul Vasos, Lausanne (CH); Riddhiman Sarkar, Prilly (CH)

(73) Assignees: Ecole Polytechnique Fédérale de Lausanne (EPFL), Lausanne (CH); Bruker BioSpin AG, Faellanden (CH)

( * ) Notice: Subject to any disclaimer, the term of this patent is extended or adjusted under 35 U.S.C. 154(b) by 361 days.

(21) Appl. No.: 11/808,950

(22) Filed: Jun. 14, 2007

(65) Prior Publication Data
US 2009/0039883 A1 Feb. 12, 2009

(30) Foreign Application Priority Data
Jun. 24, 2006 (EP) ................... 06013062

(51) Int. Cl.
*G01V 3/00* (2006.01)
(52) U.S. Cl. ...................... 324/307; 324/311
(58) Field of Classification Search ............... 324/307, 324/311
See application file for complete search history.

(56) References Cited

U.S. PATENT DOCUMENTS

| | | | | |
|---|---|---|---|---|
| 4,703,270 A | * | 10/1987 | Hall et al. | 324/309 |
| 5,166,616 A | * | 11/1992 | Doddrell et al. | 324/307 |
| 5,327,086 A | * | 7/1994 | Bodenhausen et al. | 324/307 |
| 6,133,736 A | * | 10/2000 | Pervushin et al. | 324/307 |
| 6,396,267 B1 | * | 5/2002 | Riek et al. | 324/307 |
| 6,528,997 B2 | * | 3/2003 | Zhong et al. | 324/307 |
| 7,466,127 B2 | * | 12/2008 | Chandrakumar et al. | 324/307 |

OTHER PUBLICATIONS

M. Carravetta, O.G. Johannessen, and M.H. Levitt, Beyond the $T_1$ limit: Singlet nuclear spin states in low magnetic fields. Physical Review Letters 92 (2004) 153003-153004.

(Continued)

*Primary Examiner*—Louis M Arana
(74) *Attorney, Agent, or Firm*—Paul Vincent (57) ABSTRACT

A nuclear magnetic resonance (NMR) method for singlet-state exchange NMR-spectroscopy comprises steps of excitation of single-quantum in-phase coherences, generation of single-quantum anti-phase coherences, excitation of zero-quantum coherences $ZQ_x$ and/or longitudinal two-spin order $2I_zS_z$ (="ZZ order") using a $\pi/4$ pulse, reversal of the sign of the zero-quantum coherences $ZQ_x$ under the effect of the difference of the chemical shifts of the examined spins, transformation of the zero-quantum coherences $ZQ_x$ and/or longitudinal two-spin ZZ order into singlet-state populations by means of RF irradiation during a mixing period $\tau_m$, reconversion of the singlet-state populations remaining at the end of the mixing period $\tau_m$ into zero-quantum coherences $ZQ_x$ and/or ZZ order, reversal of the sign of the zero-quantum coherences $ZQ_x$ under the effect of the difference of the chemical shifts of the examined spins, and reconversion of zero-quantum coherences $ZQ_x$ and/or ZZ order into single-quantum anti-phase coherences. With the broadband method for the excitation of single state population, NMR can monitor correlations between states that are connected through very slow processes.

7 Claims, 8 Drawing Sheets

OTHER PUBLICATIONS

M. Carravetta, and M.H. Levitt, Theory of long-lived nuclear spin states in solution nuclear magnetic resonance. I. Singlet states in low magnetic field. Journal of Chemical Physics 122 (2005) 214505-214506.

S. Cavadini, J. Dittmer, S. Antonijevic, and G. Bodenhausen, Slow diffusion by singlet state NMR spectroscopy. Journal of the American Chemical Society 127 (2005) 15744-15748.

M. Carravetta, and M.H. Levitt, Long-lived nuclear spin states in high-field solution NMR. Journal of the American Chemical Society 126 (2004) 6228-6229.

K. Gopalakrishnan, and G. Bodenhausen, in preparation. (2006). Journal of Magnetic Resonance (2006).

M. Carravetta, X. Zhao, O.G. Johannessen, W.C. Lai, M.A. Verhoeven, P.H.M. Bovee-Geurts, P.J.E. Verdegem, S. Kiihne, H. Luthman, H.J.M. de Groot, W.J. deGrip, J. Lugtenburg, and M.H. Levitt, Protein-induced bonding perturbation of the rhodopsin chromophore detected by double-quantum solid-state NMR. Journal of the American Chemical Society 126 (2004) 3948-3953.

P. Wenter, B. Furtig, A. Hainard, H. Schwalbe, and S. Pitsch, Kinetics of photoinduced RNA refolding by real-time NMR spectroscopy. Angewandte Chemie-International Edition 44 (2005) 2600-2603.

P. Wenter, G. Bodenhausen, J. Dittmer, and S. Pitsch, Kinetics of RNA Refolding in Dynamic Equilibrium by $^1$H-Detected $^{15}$N Exchange NMR Spectroscopy. Journal of the American Chemical Society in press (2006).

J. Jeener, B.H. Meier, P. Bachmann, and R.R. Ernst, Investigation of Exchange Processes by 2-Dimensional NMR Spectroscopy. Journal of Chemical Physics 71 (1979) 4546-4553.

S. Macura, and R.R. Ernst, Elucidation of Cross Relaxation in Liquids by Two-Dimensional Nmr-Spectroscopy. Molecular Physics 41 (1980) 95-117.

O.W. Sorensen, G.W. Eich, M.H. Levitt, G. Bodenhausen, and R.R. Ernst, Product Operator Formalism for the Description of Spectroscopy 16 (1983) 163-192.

M.J. Thrippleton, and J. Keeler, Elimination of zero-quantum interference in two-dimensional NMR spectra. Angewandte Chemie-International Edition 42 (2003) 3938-3941.

K.E. Cano, M.J. Thrippleton, J. Keeler, and A.J. Shaka, Cascaded z-filters for efficient single-scan suppression of zero-quantum coherence. Journal of Magnetic Resonance 167 (2004) 291-297.

A.J. Shaka, J. Keeler, T. Frenkiel, and R. Freeman, An Improved Sequence for Broad-Band Decoupling—Waltz-16. Journal of Magnetic Resonance 52 (1983) 335-338.

G. Wagner, G. Bodenhausen, N. Muller, M. Rance, O.W. Sorensen, R.R. Ernst, and K. Wuethrich, Exchange of 2-Spin Order in Nuclear Magnetic-Resonance—Separation of Exchange and Cross-Relaxation Processes. Journal of the American Chemical Society 107 (1985) 6440-6446.

M. Carravetta, O.G. Johannessen and M. H. Levitt, Beyond the $T_1$ Limit: Singlet Nuclear Spin States in Low Magnetic Fields. Phys. Rev. Lett., vol. 92, 15, (2004), 15303.

* cited by examiner

SINGLET-STATE EXCHANGE NMR SPECTROSCOPY FOR THE STUDY OF VERY SLOW DYNAMIC PROCESSES

This application claims Paris Convention priority to EP 06 013 062.2 filed Jun. 24, 2006 the entire disclosure of which is hereby incorporated by reference.

BACKGROUND OF THE INVENTION

The invention concerns a nuclear magnetic resonance (NMR) method for singlet-state exchange NMR-spectroscopy.

Long-lived singlet-states offer unique opportunities for studying very slow dynamic processes in solution-state NMR. A suite of pulse sequences is presented which can achieve broadband excitation of singlet-states in pairs of coupled spins. The most elaborate of these experiments, two-dimensional singlet-state exchange spectroscopy (SS-EXSY) is independent of the offsets of the two spins, their relative chemical shifts, and their scalar couplings. The new methods afford the study of very slow translational diffusion, chemical exchange or refolding processes, and may be suitable to observe cross-relaxation processes between singlet states using mixing times on a scale $\tau_m \approx T_S \gg T_1$. The lifetimes $T_S$ of singlet-states of pairs of protons in a partially deuterated saccharide are shown to be longer by a factor of ~23 than the longitudinal proton relaxation times $T_1$ in the same compound.

In conventional NMR studies of slow translational diffusion, chemical exchange, and refolding of biomolecules such as proteins or nucleic acids, the upper limit of the accessible time-scale is normally determined by the longitudinal relaxation time constant $T_1$, which is usually regarded as the maximum life-time of the memory of nuclear spins. NMR could not monitor correlations between states that are connected through very slow processes with a characteristic time constant longer than T1 so far. However, recent work by Caravetta and Levitt [1; 2] has shown that it is possible to excite and observe so-called singlet states in systems containing pairs of scalar-coupled spins. Such singlet states| $|S_0\rangle = N\{|\alpha\beta\rangle - |\beta\alpha\rangle\}$ with $N=2^{-1/2}$ are antisymmetric under a permutation of the two spins, and the singlet-state life-time $T_S$ is not affected by the mutual dipole-dipole interaction between these two spins. Singlet-state life-times $T_S$ can be more than an order of magnitude longer than longitudinal relaxation times $T_1$ in two-spin systems with analogous dynamic properties [1; 3]. A non-vanishing population of a singlet state $|S_0\rangle$ can be obtained by first exciting a zero-quantum coherence $ZQ_x$, i.e., a coherent superposition of two states $|\alpha\beta\rangle$ and $|\beta\alpha\rangle$ with a suitable phase, which is then converted into a population of the singlet state $|S_0\rangle$ by an appropriate radio-frequency irradiation that suppresses the effects of the offsets [4]. In practice, this irradiation converts a weakly or strongly coupled two-spin IS system ($J_{IS} \neq 0$) into an $I_2$ system with two magnetically equivalent spins. Alternatively, as shown below, a singlet state $|S_0\rangle$ can be populated by first creating longitudinal two-spin order $\sigma = 2I_zS_z$, which, in contrast to a system in thermal equilibrium with $\sigma = I_z + S_z$, comprises eigenstates $|\alpha\beta\rangle$ and $|\beta\alpha\rangle$ with non-vanishing populations. Like a $ZQ_x$ coherence, a $2I_zS_z$ term (also known as 'ZZ order'), can be converted into a population of the singlet-state $|S_0\rangle$ by appropriate radio-frequency irradiation, which in effect leads to decoupling of the $J_{IS}$ interaction. The population of a singlet state can in principle be preserved indefinitely if decoupling is ideal and if all relaxation mechanisms other than the dipolar interaction between spins I and S can be neglected. In practice, non-ideal decoupling leads to a reduction in the life-time $T_S$ [5], as does relaxation of the I and/or S spins by chemical shift anisotropy (CSA) or by dipolar interactions with further spins in the vicinity that may belong to the same molecule or to neighboring (solvent) molecules.

It has been shown that singlet states can be exploited to study slow translational diffusion [3]. Preliminary demonstrations have been carried out with a simple test molecule, 2-chloroacrylonitrile, which contains only two protons I and S with a small difference in chemical shifts $\Delta\nu_{IS} = \nu_I - \nu_S = 38$ Hz at 300 MHz (0.13 ppm) and a scalar coupling $J_{IS} = -3$ Hz [3; 6]. We have found that, contrary to earlier belief, proton-containing solvents do not lead to a dramatic reduction of the lifetime $T_S$ of the singlet states. Molecules such as saccharides that contain more protons have reduced life-times $T_S$ compared to molecules that contain only isolated proton pairs, but partial deuteration of saccharides in all positions except for the $H_5'$ and $H_5''$ protons leaves a pair of diastereotopic protons with $J_{IS} = J(H_5' H_5'') = -12.5$ Hz and a small difference in chemical shifts $\Delta\nu_{IS} = \nu_I - \nu_S = \nu(H_5') - \nu(H_5'') = 75$ Hz at 400 MHz (0.18 ppm). (Such partial deuteration can be achieved conveniently by oxidation of a perdeuterated saccharide to an aldose and subsequent reduction.) When these saccharides are incorporated into nucleic acids such as RNA, the chemical shifts of the $H_5'$ and $H_5''$ protons should be affected by conformational exchange and refolding processes [7; 8]. Such protons can therefore be used to study the kinetics of slow exchange, for example by two-dimensional exchange spectroscopy (EXSY) [9; 10]. The kinetic window of such experiments is normally limited by longitudinal relaxation to mixing times $\tau_m \approx T_1(^1H)$. In $^1H$-detected $^{15}N$ exchange spectroscopy [7] this limitation can be somewhat relaxed since one can use mixing times $\tau_m \approx T_1(^{15}N) > T_1(^1H)$. One of the objectives of this paper is to show that one can design singlet-state (SS) variants of two-dimensional exchange spectroscopy (SS-EXSY) that allow one to extend the kinetic window to mixing times $\tau_m \approx T_S(^1H) > T_1(^{15}N) > T_1(^1H)$.

The pulse sequences for singlet-state excitation that have been described so far [3; 4] suffer from a number of drawbacks: (i) the RF carrier $\nu_{RF}$ must be positioned half-way between the chemical shifts $\nu_I$ and $\nu_S$ of the two nuclei, (ii) the efficiency of the sequences depends on the difference $\Delta\nu_{IS} = \nu_I - \nu_S$ between the chemical shifts, and (iii) the efficiency also depends on the scalar coupling constant $J_{IS}$. Clearly, slow dynamic processes A↔B, such as chemical exchange or refolding of biomolecules like proteins and nucleic acids, must lead to changes in chemical shifts $\nu_I^A \neq \nu_I^B$ and/or $\nu_S^A \neq \nu_S^B$ to be observable by NMR. In general, the differences in chemical shifts may also be affected by chemical exchange, i.e., $\Delta\nu_{IS}^A = (\nu_I^A - \nu_S^A) \neq \Delta\nu_{IS}^B = (\nu_I^B - \nu_S^B)$. Furthermore, it is possible that the scalar couplings are also affected by chemical exchange, i.e., $J_{IS}^A \neq J_{IS}^B$. If singlet states are to be used to investigate such slow processes, the pulse sequences must be modified so as to become independent of chemical shifts and couplings.

SUMMARY OF THE INVENTION

In addressing these deficiencies of prior art, the instant invention proposes a method for singlet-state exchange NMR spectroscopy comprising the steps of:
  a. excitation of single-quantum in-phase coherences,
  b. generation of single-quantum anti-phase coherences,
  c. excitation of zero-quantum coherences $ZQ_x$ and/or longitudinal two-spin order $2I_zS_z$ (="ZZ order") using a $\pi/4$ pulse, d. reversal of the sign of the zero-quantum coherences $ZQ_x$ under the effect of the difference of the chemical shifts of the examined spins, e. transformation of the zero-quantum coherences $ZQ_x$ and/or longitudinal two-spin ZZ order into singlet-state populations by means of RF irradiation during a mixing period $\tau_m$, f. reconversion of the singlet-state populations remaining at the end of the mixing period $\tau_m$ into zero-quantum coherences $ZQ_x$ and/or ZZ order, g. reversal of the sign of the zero-quantum coherences $ZQ_x$ under the effect of the difference of the chemical shifts of the examined spins, h. reconversion of zero-quantum coherences $ZQ_x$ and/or ZZ order into single-quantum anti-phase coherences.

In a preferred variant of the inventive method subsequent to the generation of single-quantum anti-phase coherences from zero-quantum coherences $ZQ_x$ and/or ZZ order, these are further transformed into in-phase coherences for detection during a subsequent step.

It is advantageous if the population of the singlet state is preserved by application of composite-pulse decoupling during the mixing period $\tau_m$.

Further it is possible to carry out the generation of single-quantum anti-phase coherences independently of the J-coupling constant during the $t_1$ evolution period of a two-dimensional (="2D") experiment by a choosing the maximum duration $t_1^{max}$ of the evolution period such that one achieves sufficient resolution for separation of signals in the $\omega_1$ domain to resolve the anti-phase J-coupled multiplets.

In an advantageous variant correlations between two or more sites are observed in which singlet-state populations can be excited and between which exchange of singlet-state populations occurs during a mixing period $\tau_m$ inserted after the $t_1$ evolution period and prior to the $t_2$ acquisition period in a 2D experiment.

An especially preferred variant of the inventive method provides a suppression of zero-quantum coherences $ZQ_x$ by insertion of a first frequency-swept pulse and a first pulsed field gradient prior to the mixing period and insertion of a second frequency-swept pulse and a second pulsed field gradient after the mixing period, while the ZZ coherence is preserved.

In a development of this variant the intervals required for the reversal of the sign of the zero-quantum coherences $ZQ_x$ according to steps d and g are removed.

In a selective variant of the inventive method, which is not suitable for broadband excitation, only ZZ order is excited prior to step e by selective inversion of one of the lines in the multiplet of the spectrum.

As will be shown below, there are two distinct ways of obtaining a singlet state $|S_0\rangle$ with a non-vanishing population $p(S_0) = Tr\{\sigma|S_0\rangle\langle S_0|\}$. Prior to applying the RF field which suppresses the effects of the scalar couplings $J_{IS}$, one must either have a non-vanishing $ZQ_x$ zero-quantum coherence, or a non-vanishing longitudinal two-spin ZZ order $2I_zS_z$, or a combination of both ZQ and ZZ. There are two orthogonal forms of zero-quantum coherences, i.e. $ZQ_x = \{|\alpha\beta\rangle\langle\beta\alpha| + |\beta\alpha\rangle\langle\alpha\beta|\}/2$, and $ZQ_y = \{i|\alpha\beta\rangle\langle\beta\alpha| - i|\beta\alpha\rangle\langle\alpha\beta|\}/2$. Only the $ZQ_x$ component can be converted into a singlet state by decoupling. On the other hand, two-spin ZZ order can be expressed as a linear combination of four populations, i.e. $2I_zS_z = \{|\alpha\alpha\rangle\langle\alpha\alpha| - |\alpha\beta\rangle\langle\alpha\beta| - |\beta\alpha\rangle\langle\beta\alpha| + |\beta\beta\rangle\langle\beta\beta|\}/2$.

Only the middle two terms can contribute to the population of the singlet-state $p(S_0) = |S_0\rangle\langle S_0|$ when the RF irradiation is switched on. This population $p(S_0)$ can be determined by converting the $ZQ_x$ and ZZ terms contained in the density operator from the product base PB into the singlet-triplet base ST. Likewise, when the RF irradiation is switched off at the end of the mixing interval $\tau_m$, it is sufficient to convert the remaining $S_0$ term from the singlet-triplet base ST into $ZQ_x$ and ZZ terms in the product base PB. The latter can then be converted into observable terms following the usual rules of product operator calculations [11].

Through a simple basis transformation, any Cartesian operator product represented in the product base PB of the weakly-coupled IS system can be expressed in the singlet-triplet base ST of the $I_2$ system when the two spins are in effect made to be magnetically equivalent. The matrix representations of various terms in the two bases are given in Table I of the Supporting Information. The following combinations of Cartesian operator terms in the product base can contribute to the populations of the singlet-triplet base ST:

$$\{E, (I_z + S_z), 2I_zS_z, ZQ_x\}_{PB} \quad (1)$$

The conversion matrix is the following:

$$\begin{pmatrix} |S_0\rangle\langle S_0| \\ |T_0\rangle\langle T_0| \\ |T_1\rangle\langle T_1| \\ |T_{-1}\rangle\langle T_{-1}| \end{pmatrix} = \begin{pmatrix} \frac{1}{4} & 0 & -\frac{1}{2} & -1 \\ \frac{1}{4} & 0 & -\frac{1}{2} & 1 \\ \frac{1}{4} & \frac{1}{2} & \frac{1}{2} & 0 \\ \frac{1}{4} & -\frac{1}{2} & \frac{1}{2} & 0 \end{pmatrix} \cdot \begin{pmatrix} E \\ I_z + S_z \\ 2I_zS_z \\ ZQ_x \end{pmatrix} \quad (2)$$

It can be readily seen that only longitudinal two-spin order $2I_zS_z$ and the real zero-quantum coherence $ZQ_x$ can be converted into singlet-state populations.

The inverse transformation can be described the following matrix:

$$\begin{pmatrix} E \\ I_z + S_z \\ 2I_zS_z \\ ZQ_x \end{pmatrix} = \begin{pmatrix} 1 & 1 & 1 & 1 \\ 0 & 0 & 1 & -1 \\ -\frac{1}{2} & -\frac{1}{2} & \frac{1}{2} & \frac{1}{2} \\ -\frac{1}{2} & \frac{1}{2} & 0 & 0 \end{pmatrix} \cdot \begin{pmatrix} |S_0\rangle\langle S_0| \\ |T_0\rangle\langle T_0| \\ |T_1\rangle\langle T_1| \\ |T_{-1}\rangle\langle T_{-1}| \end{pmatrix} \quad (3)$$

Clearly, if we ignore the unobservable unity operator E, the singlet-state populations can only be converted into longitudinal two-spin order $2I_zS_z$ and real zero-quantum coherence $ZQ_x$.

The invention presents a series of new spectroscopic methods that are designed to fulfill the following demands:

i) Broadband methods for the excitation of singlet-state populations in both 1D and 2D NMR spectroscopy. These methods are designed to convert the equilibrium populations of the IS system into singlet-state populations of the $I_2$ system over a wide range of shifts and couplings. Previous methods contained intervals that had to be adapted to the coupling constants and to the offsets between the individual chemical shifts and the RF carrier, which made them impractical for molecules containing coupled spin pairs featuring a range of chemical shifts or couplings;

ii) An evaluation of adequate broadband composite decoupling methods for optimizing the lifetime $T_S$ of the singlet state when there is a non-vanishing offset between the average chemical shift of the two spins and the RF carrier;

iii) Two-dimensional experiments designed to study correlations between different environments, with a mixing time period $\tau_m$ where the 'memory' of the system is 'stored' in the form of singlet-state populations.

BRIEF DESCRIPTION OF THE DRAWING

(FIG. 1a). (II) Sequence for singlet-state excitation that uses both ZQ coherences and longitudinal two-spin order $2I_zS_z$ ("ZZ" order) in the $\tau_2$ intervals. The phase cycle was $\phi_1 = x, -x$, $\phi_2 = 2(x), 2(-x)$, $\phi_3 = 4(y), 4(-y)$, and $\phi_{rec} = 2(x,-x), 2(-x,x)$. (FIG. 1b:). (III) Sequence designed for two-dimensional singlet-state exchange spectroscopy (2D SS-EXSY) to monitor correlations between different states of a spin system undergoing a slow dynamic process. The singlet-state is excited via a combination of ZQ and ZZ terms in the $\tau_2$ intervals. The phase cycle was $\phi_1 = x, -x$, $\phi_2 = 2(y), 2(-y)$, and $\phi_{rec} = x, 2(-x), x$. Quadrature detection in the $t_1$ dimension was achieved by incrementing $\phi_1$ in the manner of time-proportional phase increments (TPPI). (FIG. 1c);

(FIG. 3a). (V) Sequence for 2D SS-EXSY using only two-spin ZZ order. The phase cycle is the same as for sequence III. (FIG. 3b);

FIG. 5 shows 2D singlet-state exchange spectrum of the $H_5'$ and $H_5''$ protons in the partly deuterated saccharide shown in inset, recorded with sequence III at 300 K and 400 MHz. Positive and negative signals are represented by continuous and dotted contours. A matrix of 32 k×256 points was acquired and transformed to 32 k×1 k points. The spectral widths in the $\omega_2$ and $\omega_1$ dimensions were 10.2 and 2.6 ppm (ca 4 and 1 kHz). The carrier was set at 4.5 ppm, at an offset $\Delta\nu=\nu_{av}-\nu_{RF}=160$ Hz between the center of the two resonances $\nu_{av}=(\nu_I+\nu_S)/2$ and the carrier $\nu_{RF}$. The duration of the mixing period with WALTZ16 decoupling was $\tau_m=12$ s and the amplitude of the decoupling field was 976 Hz. The fixed intervals were the same as in FIG. 2. The $g_1$ and $g_2$ pulsed field gradients (PFG) had 73% and 29% of their maximum intensity (50 G/cm), respectively;

DESCRIPTION OF THE PREFERRED EMBODIMENT

Figure 1A:
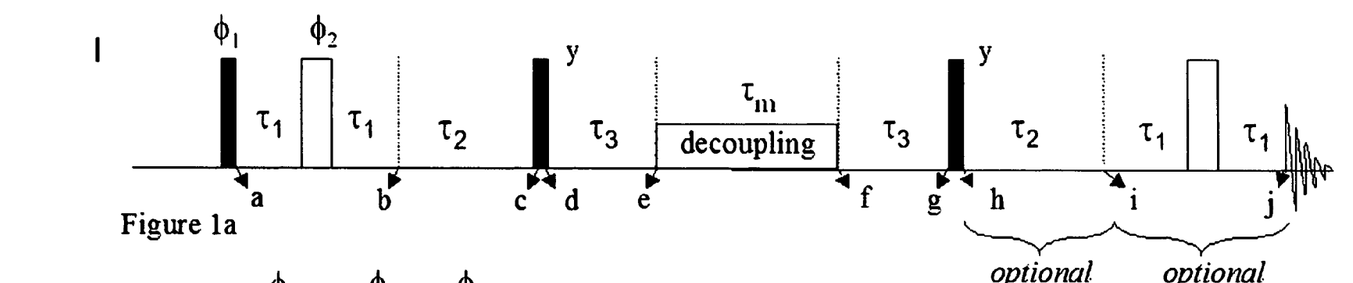
FIGS. 1a-c depict pulse sequences designed for excitation of singlet-state populations and their subsequent reconversion into observable magnetization. Pulses with flip angles of $\pi$, $\pi/2$ and $\pi/4$ (45°) are indicated by wide, narrow and hatched rectangles, respectively. All pulses are applied with phases along the x-axis of the rotating frame, unless otherwise indicated. The delays must be adjusted to the offsets $\nu_I$ and $\nu_S$ of spins I and S and to the coupling constant $J_{IS}$ according to table I: $\tau_1 = 1/(4J_{IS})$, $\tau_2 = 1/[2(\nu_I - \nu_S)]$, $\tau_3 = \tau_2/2$. Sequence I (FIG. 1a) also requires that the carrier be set halfway between the two chemical shifts, $\nu_{RF} = (\nu_I + \nu_S)/2$. (I) Sequence for singlet-state excitation designed by Caravetta & Levitt [4], expanded with some optional delays for the sake of symmetry. The singlet-state is excited only via ZQ coherences, which precess in the $\tau_3$ intervals. The phase cycle is $\phi_1 = x, -x$, $\phi_2 = 2(x), 2(-x)$, and $\phi_{rec} = x, -x$.
Figures 1B, 1C:
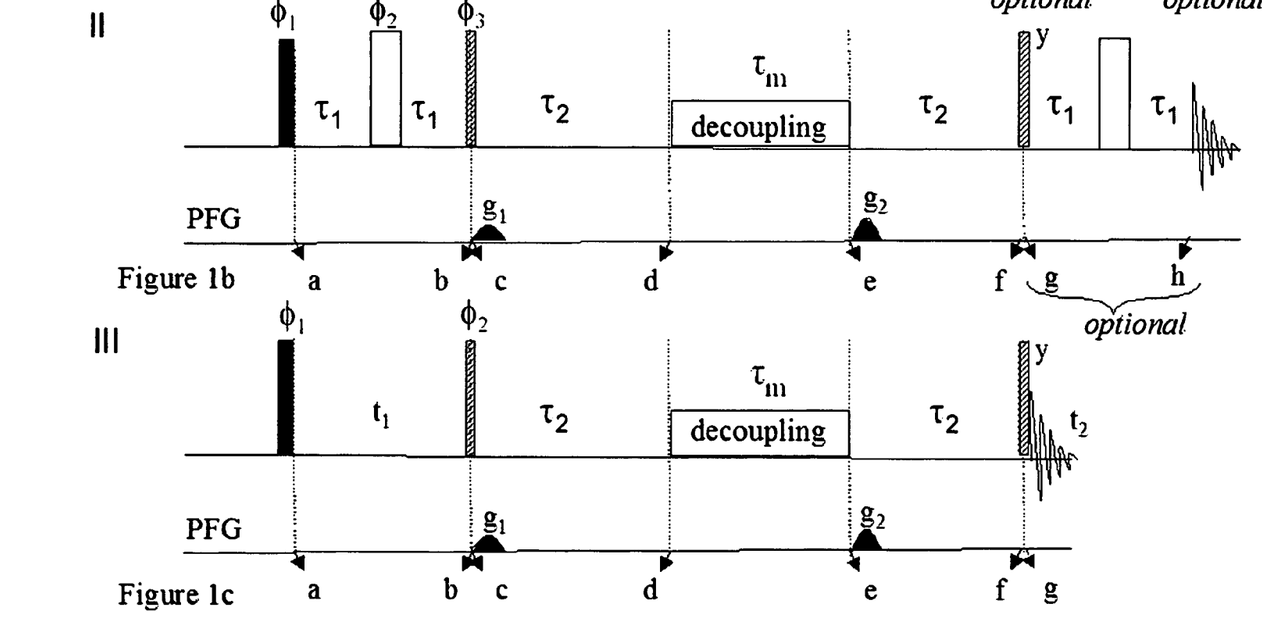

FIGS. 1a-c show a comparison between existing methods (FIG. 1a) (that require prior knowledge of the chemical shifts and scalar couplings) and new proposed techniques (FIG. 1b,c) for broadband singlet-state excitation. A step-by-step analysis of the sequences in terms of product operators is given in the Supporting Information. In sequence I of FIG. 1a (which becomes equivalent to the experiment of Caravetta and Levitt [4] if the optional delays at the end are dropped), single-quantum in-phase coherences excited at point (a) are transformed into antiphase coherences between points (a) and (b). Between points (b) and (c), the chemical shifts lead to a conversion of the real terms $2I_xS_x+2I_xS_z$ (which have the same phase) into imaginary terms $2I_yS_y-2I_yS_z$ (with opposite phases). To achieve this effect, the carrier $\nu_{RF}=(\nu_I+\nu_S)/2$ has to be set precisely halfway between the chemical shifts of spins I and S. The $(\pi/2)_y$ pulse at point (c) excites imaginary zero-quantum coherence $ZQ_y=2I_xS_y-2I_yS_x$. Between points (d) and (e), this is converted into the desired real $ZQ_x$ coherence. As explained in more detail in the Supporting Information, this coherence is transformed into a difference of populations of the singlet and central triplet states under RF irradiation starting at point (e). The triplet state populations can be neglected because they do not survive the protracted decoupling period.

Figure 2:
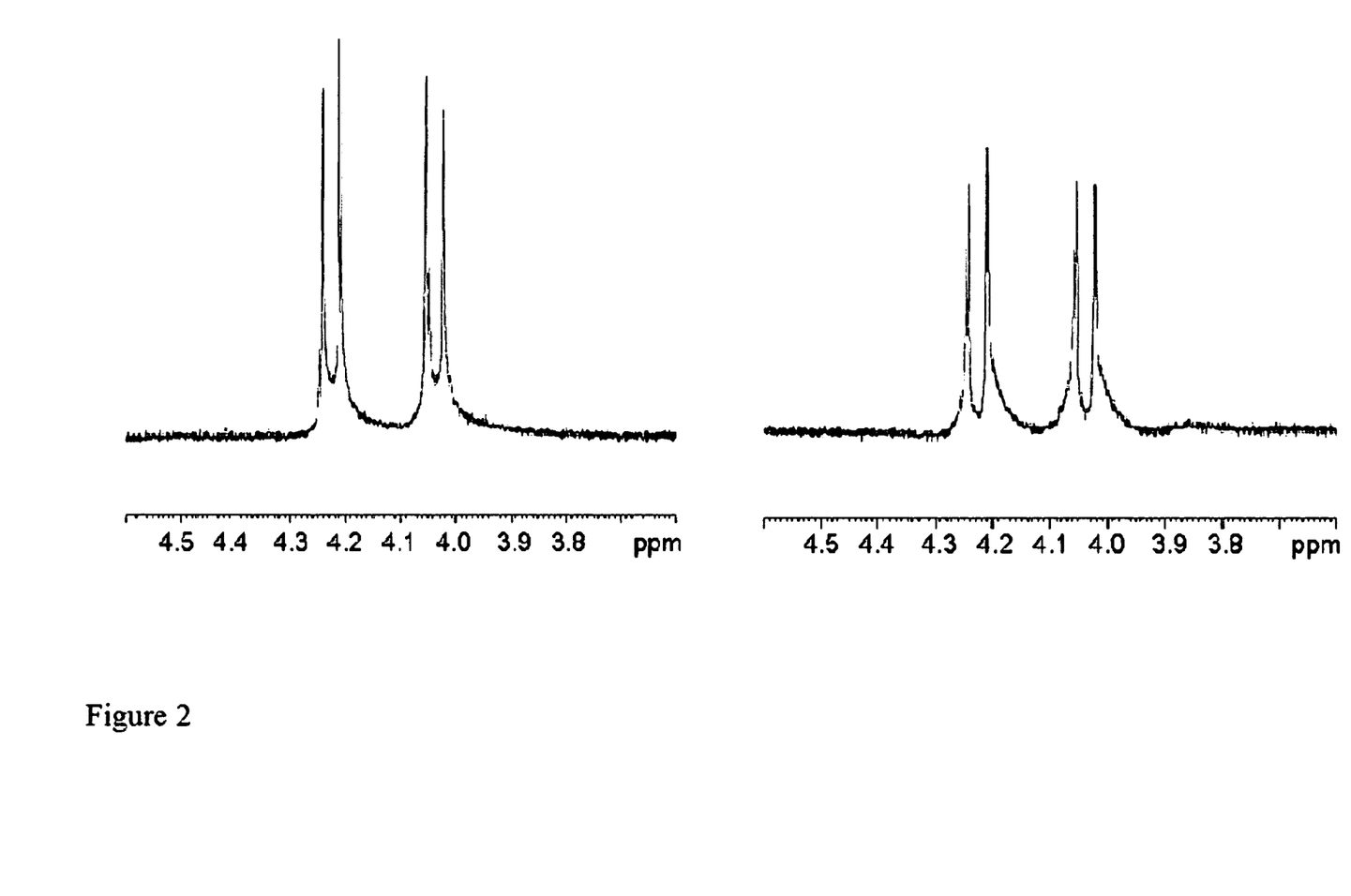
FIG. 2 shows a comparison of signals of the partly deuterated saccharide described in the text, obtained at with sequences I (left panel) and II (right panel), including the 'optional' elements in FIG. 1, at 300 K and 400 MHz. The doublets stems from the diastereotopic protons with $J(H_5', H_5'')=-12.5$ Hz. The fixed intervals were $\tau_1=20$ ms, $\tau_2=6.7$ ms, and $\tau_m=5$ s, well within the singlet-state lifetime $T_S(H_5', H_5'')=15.5$ s. The recovery delay was 8 s, much longer than $T_1(H_5')=T_1(H_5'')=0.5$ s. The continuous decoupling field had an amplitude of ca. 1.2 kHz.

In the new sequence II of FIG. 1b, designed for broadband excitation, both real $ZQ_x$ coherence and longitudinal two-spin order $2I_zS_z$, are excited using a $(\pi/4)_x$ pulse at point (b). Between time points (c) and (d), the sign of the $ZQ_x$ coherence is reversed ($ZQ_x \to -ZQ_x$) under the effect of the difference of the chemical shifts $\Delta\nu_{IS}=\nu_I-\nu_S$, a process which we may refer to as "ZQ reversal". Since $\tau_2=1/(2\Delta\nu_{IS})$, this requires prior knowledge of the relative chemical shifts, but not of the individual offsets. This ZQ reversal is necessary to prevent mutual cancellation of ZQ and ZZ contributions to the singlet state SS. As seen from the analysis provided in the Supporting Information, the singlet population created at point (d) of sequence II is equal to the singlet population created at point (e) of sequence I. The sensitivity of these two experiments is therefore comparable if losses through various relaxation processes can be neglected. Experiment I suffers from $T_2(SQ)$ in the interval $\tau_2=1/(2\Delta\nu_{IS})$, and from $T_2(ZQ)$ in the interval $\tau_3=\tau_2/2$, while experiment II is sensitive to $T_2(ZQ)$ and $T_1(ZZ)$ in the interval $\tau_2=1/(2\Delta\nu_{IS})$. It should be emphasized that the mechanisms are not the same: in sequence I, only a $ZQ_x$ term contributes to the population of the singlet-state, while a combination of $ZQ_x$ and $2I_zS_z$ contributes in sequence II. In the last part of sequence II, the singlet-state population remaining at the end of the mixing time $\tau_m$ is reconverted into single-quantum coherences via symmetrical processes. In contrast to sequence I, where the carrier must be set halfway between the two chemical shifts, i.e., $\nu_{RF}=(\nu_I+\nu_S)/2$, sequence II does not have any requirement on $\nu_{RF}$. Consequently, it is possible to study molecules with multiple sites undergoing dynamic effects if they feature different chemical shifts in the two conformations A and B, provided the chemical shift differences between the coupled pairs of protons are preserved ($\Delta\nu_{IS}^A=\Delta\nu_{IS}^B$). Indeed, the delays $\tau_2=1/(2\Delta\nu_{IS})$ are the same for both I and II, while $\tau_3=\tau_2/2$ is not required in II. If one uses the optional delays at the end of sequence II, one observes two in-phase doublets with the same sign for both spins I and S. In FIG. 2 we show a comparison between signals detected using sequences I and II in FIG. 1a, b.

The 2D sequence III in FIG. 1c does not contain any fixed [$\tau_1$-$\pi$-$\tau_1$] interval for generating antiphase magnetization, since such terms will build up naturally, with a coefficient $\sin(\pi J_{IS}t_1)$, in the course of the evolution time $t_1$. Like other 2D experiments with antiphase multiplet structures (such as COSY, zz-EXSY, etc.), this requires an adequate choice of the maximum duration $t_1^{max}$ of the evolution period so that one achieves sufficient resolution in the $\omega_1$ domain to resolve the antiphase J-coupled multiplets. In sequence III, coherence transfer from both I and S spins that undergo precession in the evolution period contribute to both ZQ and ZZ terms, and hence to the population of the singlet-state during the mixing time. The reconversion of singlet-state populations into ZQ and ZZ terms and from there into observable (antiphase) coherences of spins I and S follows similar pathways as described above for sequences I and II.

It is noteworthy that in the case where not only the average chemical shift, but also the difference $\Delta\nu_{IS}=\nu_I-\nu_S$ changes from site to site ($\Delta\nu_{IS}^A\ne\Delta\nu_{IS}^B$), the longitudinal two-spin order $2I_zS_z$ can still be used to generate singlet-state populations. In this case, it is not possible to ensure that the $ZQ_y$ terms in sequence I are converted into $ZQ_x$, nor can one be sure that the $ZQ_x$ components in sequences II or III are converted into $-ZQ_x$. Therefore, it is preferable to suppress the zero-quantum terms by a filter proposed by Thrippleton and Keeler [12; 13]. This is demonstrated in the 1D and 2D sequences IV and V of FIG. 3a,b, where two frequency-swept pulses and pulsed field gradients, both of duration $\tau_f$, are inserted prior to and after the mixing period. This makes the efficiency of singlet-state excitation and reconversion entirely independent not only of the chemical shift differences $\Delta\nu_{IS}=\nu_I-\nu_S$, but also on the individual offsets $\nu_I$ and $\nu_S$. This extension of the range comes at a cost of 50% of the signal intensity for each interval where the ZQC coherence is suppressed, so the 2D sequence V affords only 25% of the signal detected with the 2D sequence III (see Supporting Material).

Figure 4:
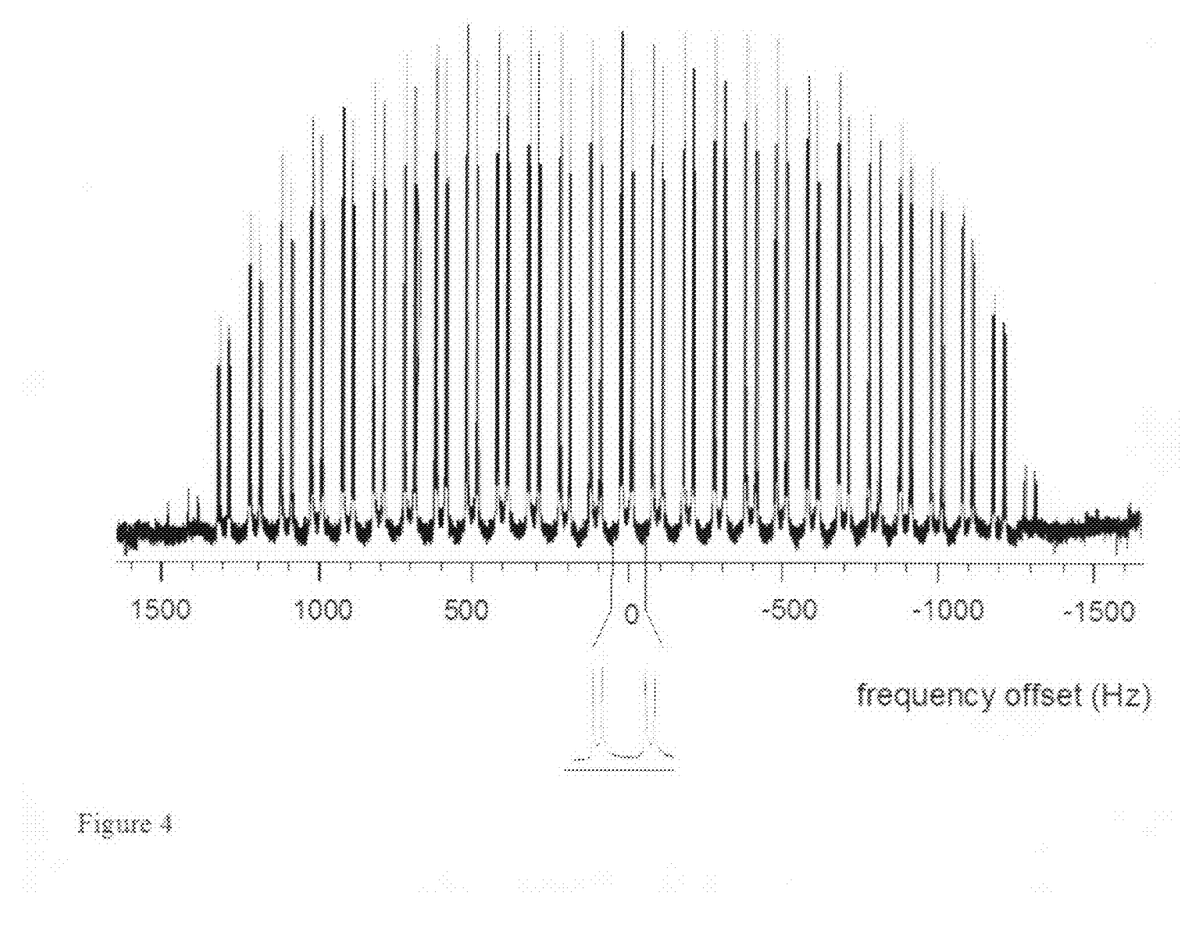
FIG. 4 shows signal intensities of the partly deuterated saccharide described in the text, obtained with sequence II, as a function of the offset $\Delta\nu=\nu_{av}-\nu_{RF}$ between the center of the two resonances $\nu_{av}=(\nu_I+\nu_S)/2$ and the carrier $\nu_{RF}$. The radio-frequency carrier $\nu_{RF}$ used for all pulses and during the decoupling period was stepped in 33 steps of 100 Hz. The amplitude of the decoupling field was $\nu_f=\omega_f/2\pi=976$ Hz and the duration of the mixing period with WALTZ16 decoupling was $\tau_m=10$ s. The fixed intervals were the same as in FIG. 2. In the center, the singlet-state lifetime was $T_S(H_5', H_5'')=15.5$ s. The inset shows the two doublets of the diastereotopic protons.

The different degree to which the presented sequences are able to excite singlet states over a wide range of frequencies in pairs of spins depends on various features of the spin systems. These features are summarized in Table I. The afore-mentioned broadband character is not the only requirement for studying pairs of spins in different environments simultaneously. In order to preserve the population of singlet states for long time periods, suitable decoupling sequences have to be used. FIG. 4 shows signals of the saccharide described below, observed using sequence II while stepping the offset between the RF carrier and the average chemical shift, using a composite-pulse radio-frequency irradiation with an RF field strength $\omega_1/(2\pi)=976$ Hz. The use of the WALTZ16 decoupling sequence [14] has proven to be effective in preserving the singlet-state over a range of ±1 kHz with respect to the carrier (±2.5 ppm at 400 MHz). This is a satisfactory range for typical groups involving coupled protons in biomolecules, such as diastereotopic $CH_2$ groups in proteins or nucleic acids.

A monosaccharide with a five-membered furanose ring was synthesized [15] in such a manner that all hydrogen atoms except those in positions $H_5'$ and $H_5''$ were substituted by deuterium atoms (we have adopted the numbering appropriate for nucleic acids). This can be achieved by oxidation of the perdeuterated sugar to obtain an aldose followed by reduction [15]. The $H_5'$ and $H_5''$ protons have a chemical shift difference of 75 Hz at 400 MHz (0.18 ppm) and a scalar coupling constant $J_{IS}=J(H_5'H_5'')=-12.5$ Hz. The sample was initially dissolved in deuterated DMSO in view of reducing intermolecular dipolar interactions. For both $H_5'$ and $H_5''$ protons, we determined the same longitudinal relaxation time constant $T_1(H_5')=T_1(H_5'')=0.69\pm0.03$ s, while the lifetime of the singlet state was found to be $T_S(H_5', H_5'')=15.5\pm0.3$ s, which is longer than $T_1$ by a factor of 23±3. The transverse relaxation time of single-quantum coherences in this system is $T_2(SQ)=0.45\pm0.1$ s, while the relaxation time of the zero-quantum coherence is also $T_2(ZQ)=0.45\pm0.02$ s. In non-deuterated DMSO, we also measured $T_S(H_5', H_5'')=15.4\pm0.3$ s. This shows that the long lifetimes of singlet states can be exploited in protonated solvents. All pulse sequences presented above were tested on this sample.

Figure 5:
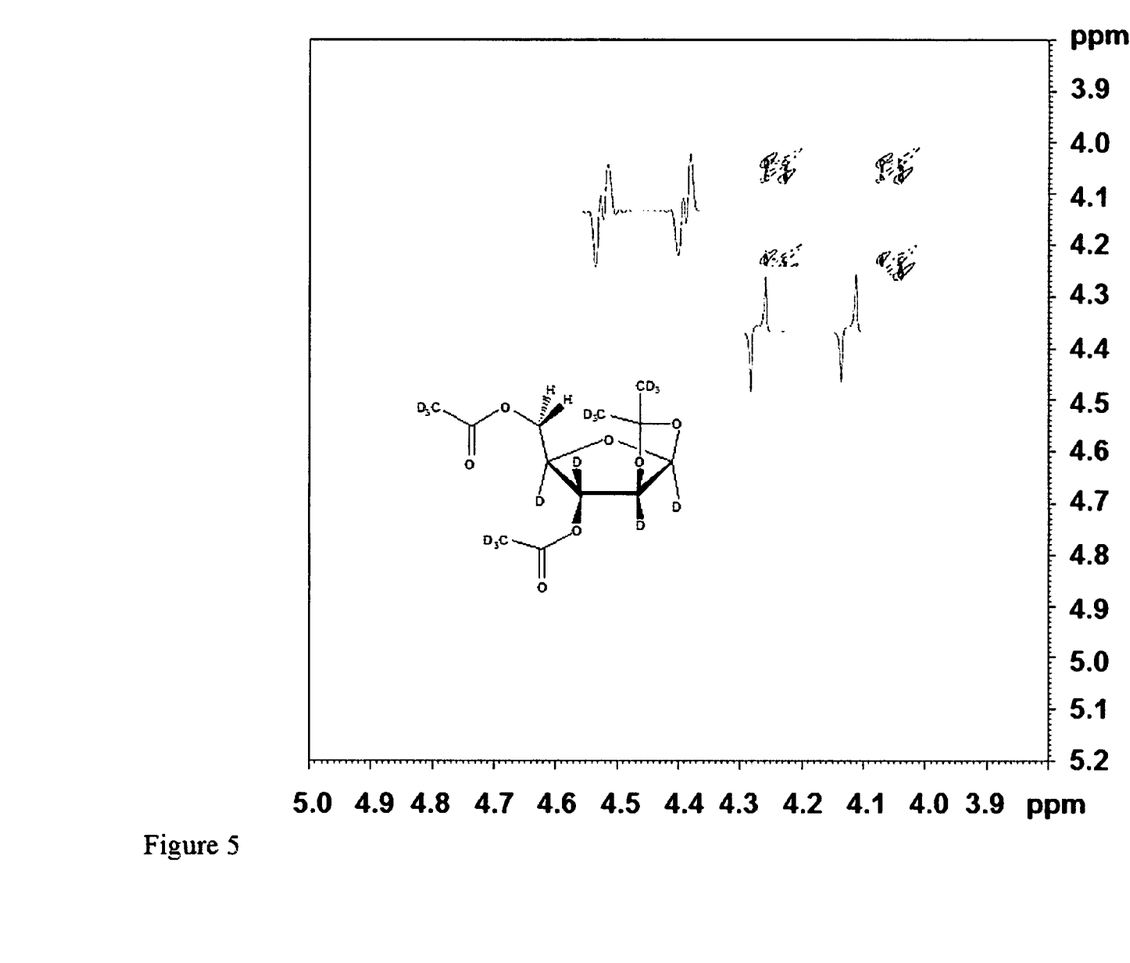
Figure 6:
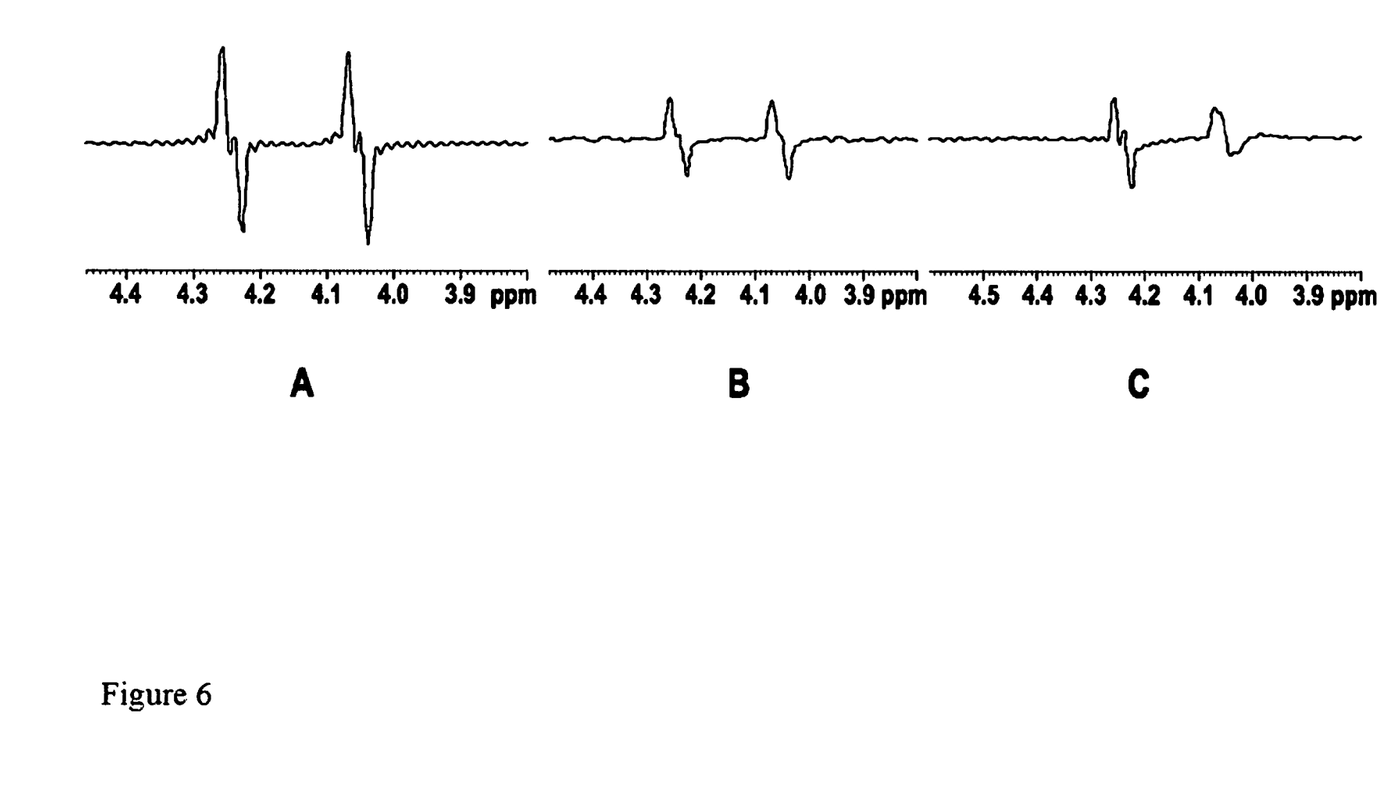
FIG. 6 shows a comparison of the signal obtained using sequence II without suppressing the ZQ coherence (panel A) with the signals obtained after suppression of the ZQ coherence (as in sequence IV) only before (panel B) and only after the decoupling period (panel C)
Figure 7:
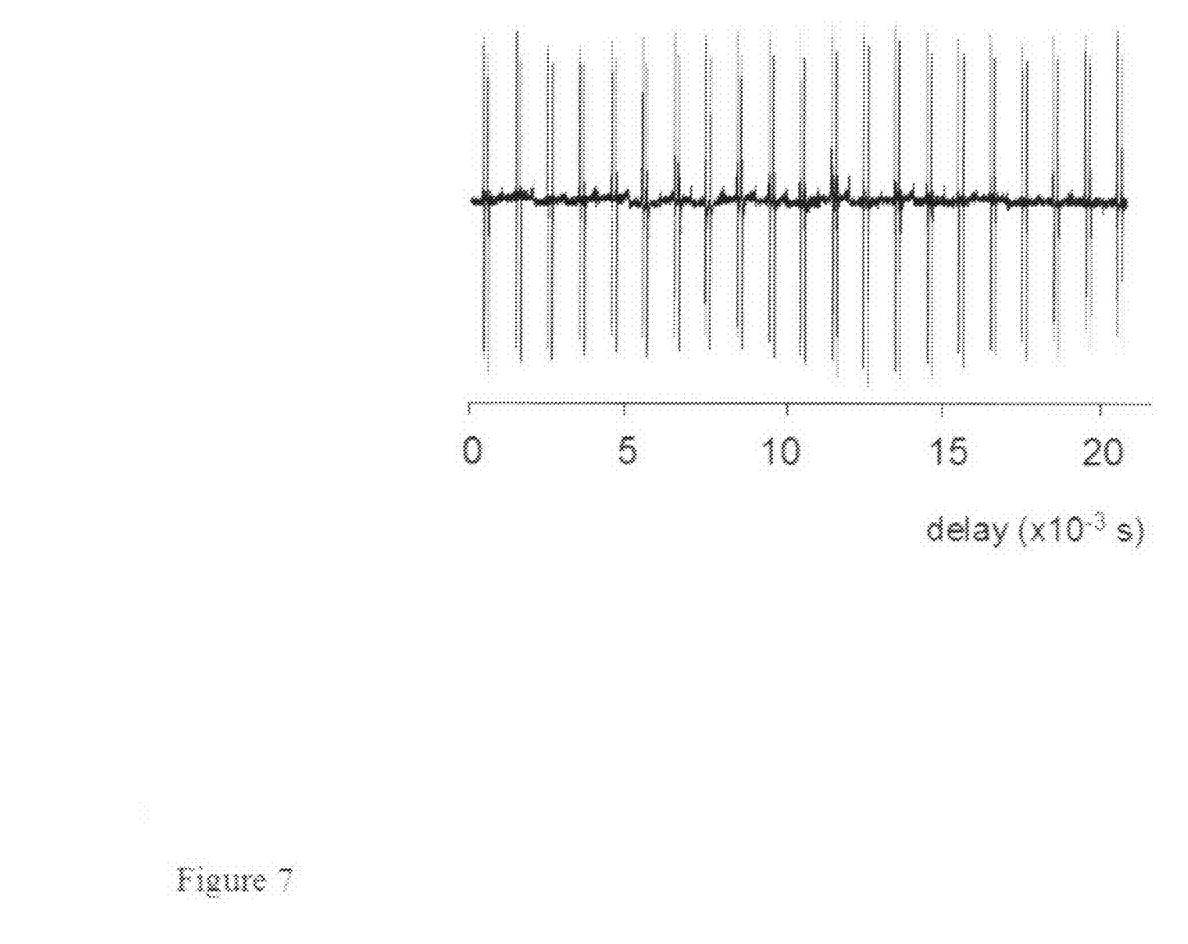
FIG. 7 shows a profile of signals obtained after suppressing the ZQ coherence prior to the decoupling period (as in sequence IV). The intensity of the signal remains constant, to a good approximation, even when a variable delay (corresponding to $\tau_2$ in sequence II) is introduced before the decoupling period.
Figure 8:
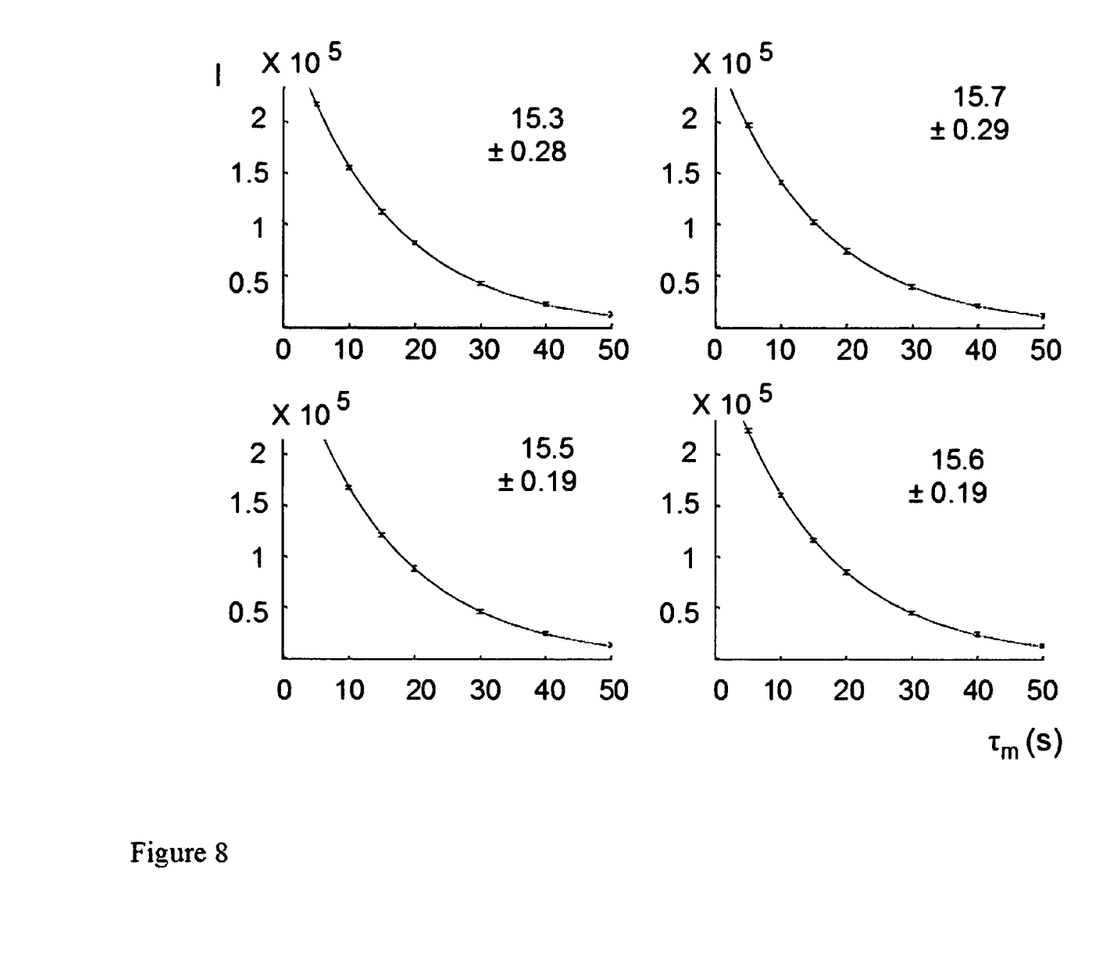
FIG. 8. shows exponential fits obtained for the four signals of the two coupled spins in the partially deuterated sugar molecule. The decay times (in s) are given. Errors were obtained from Monte Carlo simulations over 100 points within the experimental standard deviations (noise in the spectra).

FIG. 5 shows a two-dimensional singlet-state exchange (SS-EXSY) spectrum of the partly deuterated monosaccharide containing a pair of coupled protons, recorded using sequence III of FIG. 1. The 2D spectrum was deliberately acquired placing the carrier 160 Hz away from the average shift of the two proton spins, to illustrate the broadband character of the method. As predicted from the calculations, each spin gives rise to antiphase doublets in both dimensions with respect to the J coupling.

The invention demonstrates that singlet states with long lifetimes can be excited efficiently over significant spectral ranges. The singlet-state lifetimes are remarkably long in partly deuterated saccharides that could be incorporated into in nucleic acids. NMR could thus follow slow dynamic processes that may occur in such molecules over a wide range of time-scales. The structure of 2D spectra as shown in FIG. 5 is reminiscent of 2D exchange spectra using ZZ order in the mixing interval, also known as ZZ-EXSY [16]. By analogy, we like to refer to spectra obtained using singlet states as SS-EXSY. Such experiments allow one to distinguish chemical exchange from magnetization transfer via cross relaxation (NOE) [16]. In principle, it is possible to monitor higher-order cross-relaxation processes, which could convert a singlet state involving two protons I and S into another singlet state involving two different protons I' and S' through a dual flip-flop process that would lead to an interchange of the spin states of I and I' on the one hand, and of S and S' on the other. Although such processes are likely to build up very slowly, they can be expected to do so within the long lifetimes of singlet states.

TABLE I

| Adjustment with respect to | sequence I | sequence II | sequence III | sequence IV | sequence V |
|---|---|---|---|---|---|
| Coupling constant $J_{IS}$ | $\tau_1 = 1/(4J_{IS})$ | $\tau_1 = 1/(4J_{IS})$ | broadband | $\tau_1 = 1/(4J_{IS})$ | broadband |
| Relative shift $\Delta v_{IS} = v_I - v_S$ | $\tau_2 = 1/(2\Delta v_{IS})$ $\tau_3 = \tau_2/2$ | $\tau_2 = 1/(2\Delta v_{IS})$ | $\tau_2 = 1/(2\Delta v_{IS})$ | broadband | broadband |
| Average shift $(v_I + v_S)/2$ | $v_{RF} = (v_I + v_S)/2$ | broadband | broadband | broadband | broadband |

Figure 3A:
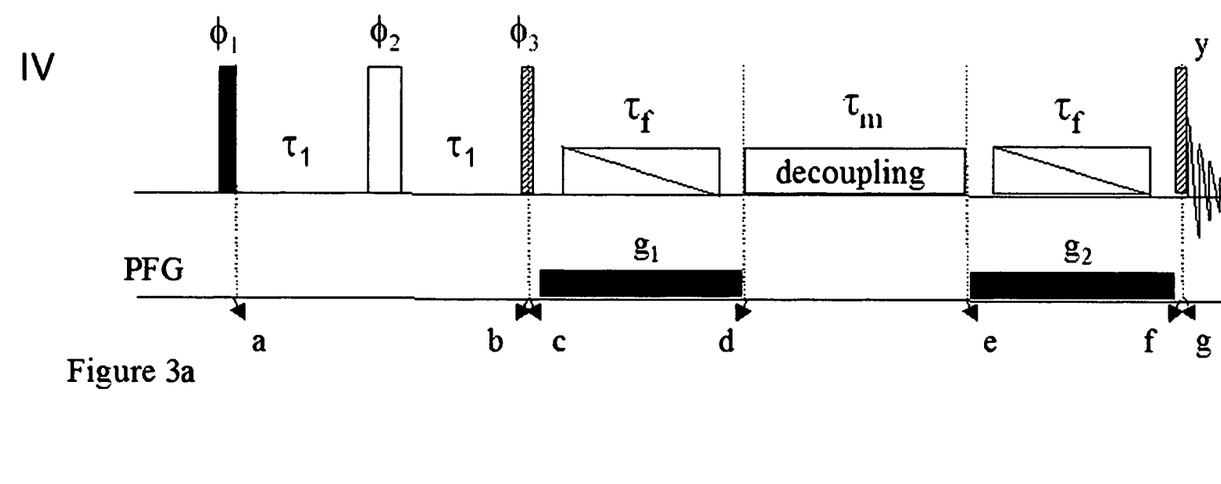
FIGS. 3a,b (IV) shows a sequence designed for excitation of singlet-state populations only via two-spin ZZ order $2I_zS_z$, while ZQ filters are used in the $\tau_f$ intervals. The phase cycle is the same as for sequence II, the rectangles with diagonal bars represent adiabatic frequency-swept pulses applied in conjunction with pulsed field gradients to suppress zero-quantum coherences.
Figure 3B:
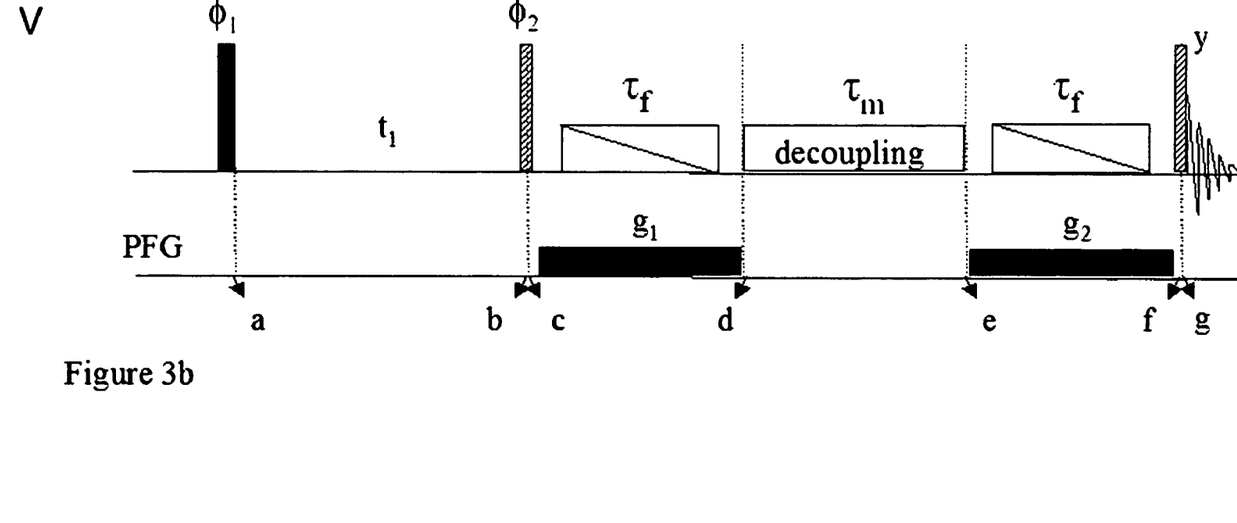

Comparison of the five sequences presented in FIGS. 1 and 3 with regard to their ability to excite singlet-state populations in various spin systems. Delays that must be adapted to spectroscopic parameters are indicated. If there is no need for any adjustment, the experiment has a broadband character with respect to the parameters.

Supporting Material i) Expressions for the Product Operators in the PB and ST Bases The basis of the IS system is: $\Phi_{PB} = \{|\alpha\alpha\rangle, |\alpha\beta\rangle, |\beta\alpha\rangle, |\beta\beta\rangle\}$
The basis of the $I_2$ system is: $\Phi_{ST} = \{|T_{+1}\rangle, |T_0\rangle, |S_0\rangle, |T_{-1}\rangle\}$
With:

$$T_{+1} = |\alpha\alpha\rangle; \quad T_0 = \frac{1}{\sqrt{2}}(|\alpha\beta\rangle + |\beta\alpha\rangle); \quad S_0 = \frac{1}{\sqrt{2}}(|\alpha\beta\rangle - |\beta\alpha\rangle); \quad T_{-1} = |\beta\beta\rangle$$

The matrix for basis conversion is:

$$V = \begin{pmatrix} 1 & 0 & 0 & 0 \\ 0 & \frac{1}{\sqrt{2}} & \frac{1}{\sqrt{2}} & 0 \\ 0 & \frac{1}{\sqrt{2}} & -\frac{1}{\sqrt{2}} & 0 \\ 0 & 0 & 0 & 1 \end{pmatrix}, \text{ with the property } V = V^{-1}$$

$$\Phi_{PB} = V \cdot \Phi_{ST}$$

As a result, the Cartesian operators (the most currently used for calculation of coherence transfer) in the PB space can be expressed in the symmetry-related ST space:

$$O_{PB} = V^{-1} O_{ST} V$$

The result of the conversion is expressed in Table I. All the operators O are normalized so that $\text{Tr}\{O^\dagger O\} = 1$;

TABLE I

| Operator | In the $\Phi_{PB}$ basis | In the $\Phi_{ST}$ basis |
|---|---|---|
| Conversion of operators between the $\Phi_{PB}$ and $\Phi_{ST}$ bases: | | |
| $\dfrac{E}{2}$ | $\dfrac{1}{2}\begin{pmatrix} 1 & 0 & 0 & 0 \\ 0 & 1 & 0 & 0 \\ 0 & 0 & 1 & 0 \\ 0 & 0 & 0 & 1 \end{pmatrix}$ | $\dfrac{1}{2}\begin{pmatrix} 1 & 0 & 0 & 0 \\ 0 & 1 & 0 & 0 \\ 0 & 0 & 1 & 0 \\ 0 & 0 & 0 & 1 \end{pmatrix}$ |
| $I_x$ | $\dfrac{1}{2}\begin{pmatrix} 0 & 0 & 1 & 0 \\ 0 & 0 & 0 & 1 \\ 1 & 0 & 0 & 0 \\ 0 & 1 & 0 & 0 \end{pmatrix}$ | $\dfrac{1}{2\sqrt{2}}\begin{pmatrix} 0 & 1 & -1 & 0 \\ 1 & 0 & 0 & 1 \\ -1 & 0 & 0 & 1 \\ 0 & 1 & 1 & 0 \end{pmatrix}$ |

TABLE I-continued

| Operator | In the $\Phi_{PB}$ basis | In the $\Phi_{ST}$ basis |
|---|---|---|
| $I_y$ | $\dfrac{1}{2}\begin{pmatrix} 0 & 0 & -i & 0 \\ 0 & 0 & 0 & -i \\ i & 0 & 0 & 0 \\ 0 & i & 0 & 0 \end{pmatrix}$ | $\dfrac{1}{2\sqrt{2}}\begin{pmatrix} 0 & -i & i & 0 \\ i & 0 & 0 & -i \\ -i & 0 & 0 & -i \\ 0 & i & i & 0 \end{pmatrix}$ |
| $I_z$ | $\dfrac{1}{2}\begin{pmatrix} 1 & 0 & 0 & 0 \\ 0 & 1 & 0 & 0 \\ 0 & 0 & -1 & 0 \\ 0 & 0 & 0 & -1 \end{pmatrix}$ | $\dfrac{1}{2}\begin{pmatrix} 1 & 0 & 0 & 0 \\ 0 & 0 & 1 & 0 \\ 0 & 1 & 0 & 0 \\ 0 & 0 & 0 & -1 \end{pmatrix}$ |
| $S_x$ | $\dfrac{1}{2}\begin{pmatrix} 0 & 1 & 0 & 0 \\ 1 & 0 & 0 & 0 \\ 0 & 0 & 0 & 1 \\ 0 & 0 & 1 & 0 \end{pmatrix}$ | $\dfrac{1}{2\sqrt{2}}\begin{pmatrix} 0 & 1 & 1 & 0 \\ 1 & 0 & 0 & 1 \\ 1 & 0 & 0 & -1 \\ 0 & 1 & -1 & 0 \end{pmatrix}$ |
| $S_y$ | $\dfrac{1}{2}\begin{pmatrix} 0 & -i & 0 & 0 \\ i & 0 & 0 & 0 \\ 0 & 0 & 0 & -i \\ 0 & 0 & i & 0 \end{pmatrix}$ | $\dfrac{1}{2\sqrt{2}}\begin{pmatrix} 0 & -i & -i & 0 \\ i & 0 & 0 & -i \\ i & 0 & 0 & i \\ 0 & i & -i & 0 \end{pmatrix}$ |
| $S_z$ | $\dfrac{1}{2}\begin{pmatrix} 1 & 0 & 0 & 0 \\ 0 & -1 & 0 & 0 \\ 0 & 0 & 1 & 0 \\ 0 & 0 & 0 & -1 \end{pmatrix}$ | $\dfrac{1}{2}\begin{pmatrix} 1 & 0 & 0 & 0 \\ 0 & 0 & -1 & 0 \\ 0 & -1 & 0 & 0 \\ 0 & 0 & 0 & -1 \end{pmatrix}$ |
| $2I_x S_z$ | $\dfrac{1}{2}\begin{pmatrix} 0 & 0 & 1 & 0 \\ 0 & 0 & 0 & -1 \\ 1 & 0 & 0 & 0 \\ 0 & -1 & 0 & 0 \end{pmatrix}$ | $\dfrac{1}{2\sqrt{2}}\begin{pmatrix} 0 & 1 & -1 & 0 \\ 1 & 0 & 0 & -1 \\ -1 & 0 & 0 & -1 \\ 0 & -1 & -1 & 0 \end{pmatrix}$ |
| $2I_y S_z$ | $\dfrac{1}{2}\begin{pmatrix} 0 & 0 & -i & 0 \\ 0 & 0 & 0 & i \\ i & 0 & 0 & 0 \\ 0 & -i & 0 & 0 \end{pmatrix}$ | $\dfrac{1}{2\sqrt{2}}\begin{pmatrix} 0 & -i & i & 0 \\ i & 0 & 0 & i \\ -i & 0 & 0 & i \\ 0 & -i & -i & 0 \end{pmatrix}$ |
| $2I_z S_x$ | $\dfrac{1}{2}\begin{pmatrix} 0 & 1 & 0 & 0 \\ 1 & 0 & 0 & 0 \\ 0 & 0 & 0 & -1 \\ 0 & 0 & -1 & 0 \end{pmatrix}$ | $\dfrac{1}{2\sqrt{2}}\begin{pmatrix} 0 & 1 & 1 & 0 \\ 1 & 0 & 0 & -1 \\ 1 & 0 & 0 & 1 \\ 0 & -1 & 1 & 0 \end{pmatrix}$ |
| $2I_z S_y$ | $\dfrac{1}{2}\begin{pmatrix} 0 & -i & 0 & 0 \\ i & 0 & 0 & 0 \\ 0 & 0 & 0 & i \\ 0 & 0 & -i & 0 \end{pmatrix}$ | $\dfrac{1}{2\sqrt{2}}\begin{pmatrix} 0 & -i & -i & 0 \\ i & 0 & 0 & i \\ i & 0 & 0 & -i \\ 0 & -i & i & 0 \end{pmatrix}$ |

TABLE I-continued

| Operator | In the $\Phi_{PB}$ basis | In the $\Phi_{ST}$ basis |
|---|---|---|
| $2I_zS_z$ | $\frac{1}{2}\begin{pmatrix} 1 & 0 & 0 & 0 \\ 0 & -1 & 0 & 0 \\ 0 & 0 & -1 & 0 \\ 0 & 0 & 0 & 1 \end{pmatrix}$ | $\frac{1}{2}\begin{pmatrix} 1 & 0 & 0 & 0 \\ 0 & -1 & 0 & 0 \\ 0 & 0 & -1 & 0 \\ 0 & 0 & 0 & 1 \end{pmatrix}$ |
| $ZQ_x$ | $\frac{1}{2}\begin{pmatrix} 0 & 0 & 0 & 0 \\ 0 & 0 & 1 & 0 \\ 0 & 1 & 0 & 0 \\ 0 & 0 & 0 & 0 \end{pmatrix}$ | $\frac{1}{2}\begin{pmatrix} 0 & 0 & 0 & 0 \\ 0 & 1 & 0 & 0 \\ 0 & 0 & -1 & 0 \\ 0 & 0 & 0 & 0 \end{pmatrix}$ |
| $ZQ_y$ | $\frac{1}{2}\begin{pmatrix} 0 & 0 & 0 & 0 \\ 0 & 0 & -i & 0 \\ 0 & i & 0 & 0 \\ 0 & 0 & 0 & 0 \end{pmatrix}$ | $\frac{1}{2}\begin{pmatrix} 0 & 0 & 0 & 0 \\ 0 & 0 & i & 0 \\ 0 & -i & 0 & 0 \\ 0 & 0 & 0 & 0 \end{pmatrix}$ |
| $DQ_x$ | $\frac{1}{2}\begin{pmatrix} 0 & 0 & 0 & 1 \\ 0 & 0 & 0 & 0 \\ 0 & 0 & 0 & 0 \\ 1 & 0 & 0 & 0 \end{pmatrix}$ | $\frac{1}{2}\begin{pmatrix} 0 & 0 & 0 & 1 \\ 0 & 0 & 0 & 0 \\ 0 & 0 & 0 & 0 \\ 1 & 0 & 0 & 0 \end{pmatrix}$ |
| $DQ_y$ | $\frac{1}{2}\begin{pmatrix} 0 & 0 & 0 & -i \\ 0 & 0 & 0 & 0 \\ 0 & 0 & 0 & 0 \\ i & 0 & 0 & 0 \end{pmatrix}$ | $\frac{1}{2}\begin{pmatrix} 0 & 0 & 0 & -i \\ 0 & 0 & 0 & 0 \\ 0 & 0 & 0 & 0 \\ i & 0 & 0 & 0 \end{pmatrix}$ |

The $I_2$ population operators in the two basis sets:

| | | |
|---|---|---|
| $S_0$ | $\frac{1}{\sqrt{2}}\begin{pmatrix} 0 & 0 & 0 & 0 \\ 0 & 1 & 0 & 0 \\ 0 & 0 & -1 & 0 \\ 0 & 0 & 0 & 0 \end{pmatrix}$ | $\begin{pmatrix} 0 & 0 & 0 & 0 \\ 0 & 0 & 0 & 0 \\ 0 & 0 & 1 & 0 \\ 0 & 0 & 0 & 0 \end{pmatrix}$ |
| $T_0$ | $\frac{1}{\sqrt{2}}\begin{pmatrix} 0 & 0 & 0 & 0 \\ 0 & 1 & 0 & 0 \\ 0 & 0 & 1 & 0 \\ 0 & 0 & 0 & 0 \end{pmatrix}$ | $\begin{pmatrix} 0 & 0 & 0 & 0 \\ 0 & 1 & 0 & 0 \\ 0 & 0 & 0 & 0 \\ 0 & 0 & 0 & 0 \end{pmatrix}$ |
| $T_{-1}$ | $\begin{pmatrix} 0 & 0 & 0 & 0 \\ 0 & 0 & 0 & 0 \\ 0 & 0 & 0 & 0 \\ 0 & 0 & 0 & 1 \end{pmatrix}$ | $\begin{pmatrix} 0 & 0 & 0 & 0 \\ 0 & 0 & 0 & 0 \\ 0 & 0 & 0 & 0 \\ 0 & 0 & 0 & 1 \end{pmatrix}$ |
| $T_{+1}$ | $\begin{pmatrix} 1 & 0 & 0 & 0 \\ 0 & 0 & 0 & 0 \\ 0 & 0 & 0 & 0 \\ 0 & 0 & 0 & 0 \end{pmatrix}$ | $\begin{pmatrix} 1 & 0 & 0 & 0 \\ 0 & 0 & 0 & 0 \\ 0 & 0 & 0 & 0 \\ 0 & 0 & 0 & 0 \end{pmatrix}$ | ii) Description of the Pulse Sequences in Terms of Product Operators

Sequence I:
 (a) $-I_y-S_y$
 (b) $2I_xS_z + 2I_zS_x$
 (c) $(2I_yS_z - 2I_xS_y)\cdot\cos(\pi J/(2\Delta\nu)) - (I_x - S_x)\cdot\sin(\pi J/(2\Delta\nu))$
  → for $\Delta\nu = 5\cdot J$: $\sin[\pi J/(2\Delta\nu)] \sim 0.31$, $\cos[\pi J/(2\Delta\nu)] \sim 0.95$, so ca. 5% of the magnetization is lost, as the terms $(I_x - S_x)$ do not contribute to the final signal
 (d) $(2I_yS_x - 2I_xS_y) = 2ZQ_y$
 (e) $-2ZQ_x = |S_0\rangle\langle S_0| - |T_0\rangle\langle T_0|$
 (f) $|S_0\rangle\langle S_0|\exp(-\tau_m/T_S) = [E/4 - I_zS_z - ZQ_x]\exp(-\tau_m/T_S)$
 (g) $-aI_zS_z - aZQ_y$; $a = \exp(-\tau_m/T_S)$
 (h) $-aI_yS_y + (\frac{1}{2})\cdot a[2I_xS_z - 2I_zS_x]$
  → $-aI_yS_y$ remains as multiple quantum coherence and will not be detected
 (i) $(\frac{1}{2})\cdot a[2I_yS_z + 2I_zS_y]$
 (j) $-(\frac{1}{2})\cdot a[I_x + S_x]$ Sequence II
 (a) $-I_y - S_y$
 (b) $2I_xS_z + 2I_zS_x$
 (c) $(2I_xS_x - 2I_zS_z) = ZQ_x + DQ_x - 2I_zS_z$
  → $DQ_x$ is destroyed by the spoiling gradient $g_1$
 (d) $-ZQ_x - 2I_zS_z = |S_0\rangle\langle S_0| - (\frac{1}{2})\cdot(|T_{-1}\rangle\langle T_{-1}| + |T_{+1}\rangle\langle T_{+1}|)$
 (e) $|S_0\rangle\langle S_0|\exp(-\tau_m/T_S) = [E/4 - I_zS_z - ZQ_x]\exp(\tau_m/T_S)$
 (f) $-aI_zS_z + aZQ_x$; $a = \exp(-\tau_m/T_S)$
 (g) $-a(I_xS_z + I_zS_x) + aI_yS_y$
 (h) $aI_yS_y$ (not detected) $-(\frac{1}{2})\cdot a[I_y + S_y]$ Sequence III
 (a) $-I_y - S_y$
 (b) $-I_y\cos(2\pi\nu_1 t_1)\cdot\cos(\pi J t_1) + I_x\sin(2\pi\nu_1 t_1)\cdot\cos(\pi J t_1)$
  $+2I_xS_z\cos(2\pi\nu_1 t_1)\cdot\sin(\pi J t_1) + 2I_yS_z\sin(2\pi\nu_1 t_1)\cdot\sin(\pi J t_1)$
  $-S_y\cos(2\pi\nu_S t_1)\cdot\cos(\pi J t_1) + S_x\sin(2\pi\nu_S t_1)\cdot\cos(\pi J t_1)$
  $+2I_zS_x\cos(2\pi\nu_S t_1)\cdot\sin(\pi J t_1) + 2I_zS_y\sin(2\pi\nu_S t_1)\cdot\sin(\pi J t_1)$
 (c) The various terms at time (b) can be grouped in order to describe the effect of the $45°_y$ pulse:
  terms 1 and 5:

$-[I_y\cos(2\pi\nu_1 t_1) + S_y\cos(2\pi\nu_S t_1)]\cdot\cos(\pi J t_1)$

→ destroyed by the $g_1$ gradient
  terms 2 and 6:

$(\frac{1}{2}^{1/2})\cdot\cos(\pi J t_1)\cdot[I_x\sin(2\pi\nu_1 t_1) + S_x\sin(2\pi\nu_S t_1)]$ → destroyed by the $g_1$ gradient $-(\frac{1}{2}^{1/2})\cdot\cos(\pi J t_1)\cdot[I_z\sin(2\pi\nu_1 t_1) + S_z\sin(2\pi\nu_S t_1)]$ → has no contribution to the singlet state population and relaxes much faster than it
  terms 3 and 7:

$(I_xS_x - I_zS_z)\cdot[\cos(2\pi\nu_1 t_1) + \cos(2\pi\nu_S t_1)]\cdot\sin(\pi J t_1) = (\frac{1}{2})\cdot[ZQ_x + DQ_x - 2I_zS_z]\cdot[\cos(2\pi\nu_1 t_1) + \cos(2\pi\nu_S t_1)]\cdot\sin(\pi J t_1)$ → the ZQ and longitudinal two-spin order contributions contribute to the population of the singlet state and will be preserved $(I_xS_z - I_zS_x)\cdot[\cos(2\pi\nu_1 t_1) - \cos(2\pi\nu_S t_1)]\cdot\sin(\pi J t_1)$ → destroyed by the $g_1$ gradient
  terms 4 and 8:

$(\frac{1}{2}^{1/2})\cdot[2I_yS_x + 2I_zS_z]\cdot\sin(2\pi\nu_1 t_1)\cdot\sin(\pi J t_1) + (\frac{1}{2}^{1/2})\cdot[2I_xS_y + 2I_zS_y]\cdot\sin(2\pi\nu_S t_1)\cdot\sin(\pi J t_1)$ → the single quantum antiphase terms are destroyed by the $g_1$ gradient the other terms can be written as:

$(\frac{1}{2}^{1/2})\cdot DQ_y[\sin(2\pi\nu_1 t_1) + \sin(2\pi\nu_S t_1)] + (\frac{1}{2}^{1/2})\cdot ZQ_y[\sin(2\pi\nu_1 t_1) - \sin(2\pi\nu_S t_1)]$ → the DQ term is destroyed by the $g_1$ gradient and the ZQ is refocused during the next evolution period to:
  $-(\frac{1}{2}^{1/2})\cdot ZQ_y[\sin(2\pi\nu_1 t_1) - \sin(2\pi\nu_S t_1)]$
  Thus, it does not contribute to the singlet state and will relax to zero much faster than the other terms.

Finally, the only terms that will be preserved through the next two evolution steps are:

$(\frac{1}{2})\cdot(ZQ_x - 2I_zS_z)\cdot[\cos(2\pi\nu_1 t_1) + \cos(2\pi\nu_S t_1)]\cdot\sin(\pi J t_1)$ Or, with the next TPPI phase of the first $\pi/2$ pulse:

$$-(\tfrac{1}{2})\cdot(ZQ_x-2I_zS_z)\cdot[\sin(2\pi v_1 t_1)+\sin(2\pi v_S t_1)]\cdot\sin(\pi J t_1)$$

(d) $(\tfrac{1}{2})\cdot[-ZQ_x-2I_zS_z]\cdot[\exp(-i2\pi v_1 t_1)+\exp(-i2\pi v_S t_1)]\cdot\sin(\pi J t_1)=(\tfrac{1}{2})\cdot[|S_0\rangle\langle S_0|-(\tfrac{1}{2})\cdot(|T_{-1}\rangle\langle T_{-1}|+|T_{+1}\rangle\langle T_{+1}|)]\cdot[\exp(-i2\pi v_1 t_1)+\exp(-2\pi v_S t_1)]\cdot\sin(\pi J t_1)$ (e) $(\tfrac{1}{2})\cdot|S_0\rangle\langle S_0|\exp(-\tau_m/T_S)\cdot[\exp(-i2\pi v_1 t_1)+\exp(-i2\pi v_S t_1)]\cdot\sin(\pi J t_1)=(\tfrac{1}{2})\cdot[E/4-I_zS_z-ZQ_x]\exp(-\tau_m/T_S)\cdot[\exp(-i2\pi v_1 t_1)+\exp(-i2\pi v_S t_1)]\cdot\sin(\pi J t_1)$ (f) $(\tfrac{1}{2})\cdot a[-I_zS_z+ZQ_x]\cdot[\exp(-i2\pi v_1 t_1)+\exp(-i2\pi v_S t_1)]\cdot\sin(\pi J t_1);\ a=\exp(-\tau_m/T_S)$ (g) $-(\tfrac{1}{2})\cdot I_yS_y\cdot a[\exp(-i2\pi v_1 t_1)+\exp(-i2\pi v_S t_1)]\cdot\sin(\pi J t_1)$
→ not detected $$-(\tfrac{1}{2})\cdot a(I_xS_z+I_zS_x)\cdot[\exp(-i2\pi v_1 t_1)+\exp(-i2\pi v_S t_1)]\cdot\sin(\pi J t_1)$$

This generates one diagonal and one cross-peak signal for each spin, both antiphase with respect to the J-coupling.

Sequence IV
(a) $-I_y, -S_y$
(b) $2I_xS_z+2I_zS_x$
(c) $(2I_xS_z-2I_zS_z)=(ZQ_x+DQ_x-2I_zS_z)$
→ The frequency-swept pulse and the spoiling gradient g1 destroy ZQx and DQx
(d) $-2I_zS_z=(\tfrac{1}{2})\cdot|S_0\rangle\langle S_0|+(\tfrac{1}{2})\cdot|T_0\rangle\langle T_0|-(\tfrac{1}{2})\cdot(|T_{-1}|+T_{+1}\rangle\langle T_{+1}|)$
(e) $(\tfrac{1}{2})\cdot|S_0\rangle\langle S_0|\exp(-\tau_m/T_S)=(\tfrac{1}{2})\cdot[E/4-I_zS_z-ZQ_x]\exp(-\tau_m/T_S)$
→ The frequency-swept pulse and the spoiling gradient g2 destroy ZQx
(f) $-(\tfrac{1}{2})\cdot a I_zS_z;\ a=\exp(-\tau_m/T_S)$
(g) $-(\tfrac{1}{4})\cdot a(I_xS_z+I_zS_x)$ Sequence V
(a) $-I_y, -S_y$
(b) $-I_y\cos(2\pi v_1 t_1)\cdot\cos(\pi J t_1)+I_x\sin(2\pi v_1 t_1)\cdot\cos(\pi J t_1)+2I_xS_z\cos(2\pi v_1 t_1)\cdot\sin(\pi J t_1)+2I_yS_z\sin(2\pi v_1 t_1)\cdot\sin(\pi J t_1)$
$-S_y\cos(2\pi v_S t_1)\cdot\cos(\pi J t_1)+S_x\sin(2\pi v_S t_1)\cdot\cos(\pi J t_1)+2I_zS_x\cos(2\pi v_S t_1)\cdot\sin(\pi J t_1)+2I_zS_y\sin(2\pi v_S t_1)\cdot\sin(\pi J t_1)$
(c) The various terms in b) can be grouped in order to describe the effect of the $45°_y$ pulse:

Grouping terms 1 and 5:

$$-[I_y\cos(2\pi v_1 t_1)+S_y\cos(2\pi v_S t_1)]\cdot\cos(\pi J t_1)$$

→ destroyed by the $g_1$ gradient terms 2 and 6:

$$(\tfrac{1}{2}^{1/2})\cdot\cos(\pi J t_1)\cdot[I_x\sin(2\pi v_1 t_1)+S_x\sin(2\pi v_S t_1)]$$

→ destroyed by the $g_1$ gradient $$-(\tfrac{1}{2}^{1/2})\cdot\cos(\pi J t_1)\cdot[I_z\sin(2\pi v_1 t_1)+S_z\sin(2\pi v_S t_1)]$$

→ has no contribution to the singlet state population and relaxes much faster than it terms 3 and 7:

$$(I_xS_z-I_zS_z)\cdot[\cos(2\pi v_1 t_1)+\cos(2\pi v_S t_1)]\cdot\sin(\pi J t_1)=(\tfrac{1}{2})\cdot[ZQ_x+DQ_x-2I_zS_z]\cdot[\cos(2\pi v_1 t_1)+\cos(2\pi v_S t_1)]\cdot\sin(\pi J t_1)$$

→ the ZQ ad DQ terms are destroyed by the frequency-swept pulse and gradient $g_1$, while the longitudinal two-spin order contributions contributes to the population of the singlet state and will be preserved $$(I_xS_z-I_zS_x)\cdot[\cos(2\pi v_1 t_1)-\cos(2\pi v_S t_1)]\cdot\sin(\pi J t_1)$$

→ destroyed by the $g_1$ gradient terms 4 and 8:

$$(\tfrac{1}{2}^{1/2})\cdot[2I_yS_x+2I_yS_z]\cdot\sin(2\pi v_1 t_1)\cdot\sin(\pi J t_1)+(\tfrac{1}{2}^{1/2})\cdot[2I_xS_y+2I_zS_y]\cdot\sin(2\pi v_S t_1)\cdot\sin(\pi J t_1)$$

→ the single quantum antiphase terms are destroyed by the gi gradient the other terms can be written as:

$$(\tfrac{1}{2}^{1/2})\cdot DQ_y[\sin(2\pi v_1 t_1)+\sin(2\pi v_S t_1)]+(\tfrac{1}{2}^{1/2})\cdot ZQ_y[\sin(2\pi v_1 t_1)-\sin(2\pi v_S t_1)]$$

→ the frequency-swept pulse and the g1 gradient destroy the ZQ and DQ terms

Finally, the only terms that will be preserved through the next two evolution steps are:

$$-I_zS_z\cdot[\cos(2\pi v_1 t_1)+\cos(2\pi v_S t_1)]\cdot\sin(\pi J t_1)$$

Or, with the next TPPI phase of the first $\pi/2$ pulse:

$$I_zS_z\cdot[\sin(2\pi v_1 t_1)+\sin(2\pi v_S t_1)]\cdot\sin(\pi J t_1)$$

(d) $-I_zS_z\cdot[\exp(-i2\pi v_1 t_1)+\exp(-i2\pi v_S t_1)]\cdot\sin(\pi J t_1)=(\tfrac{1}{4})[|S_0\rangle\langle S_0|+|T_0\rangle\langle T_0|-T_{-1}\rangle\langle T_{-1}|-T_{+1}\rangle\langle T_{+1}|]\cdot[\exp(-2\pi v_1 t_1)+\exp(-i2\pi v_S t_1)]\cdot\sin(\pi J t_1)$ (e) $(\tfrac{1}{4})\cdot|S_0\rangle\langle S_0|\exp(-\tau_m/T_S)\cdot[\exp(-i2\pi v_1 t_1)+\exp(-i2\pi v_S t_1)]\cdot\sin(\pi J t_1)=(\tfrac{1}{4})\cdot[E/4-I_zS_z-ZQ_x]\exp(-\tau_m/T_S)\cdot[\exp(-i2\pi v_1 t_1)+\exp(-i2\pi v_S t_1)]\cdot\sin(\pi J t_1)$ → The ZQ term is destroyed by the frequency-swept pulse and the $g_2$ gradient (f) $-(\tfrac{1}{4})\cdot a I_zS_z\cdot[\exp(-i2\pi v_1 t_1)+\exp(-i2\pi v_S t_1)]\cdot\sin(\pi J t_1);\ a=\exp(-\tau_m/T_S)$ (g) $-(\tfrac{1}{8})\cdot a(I_xS_z+I_zS_x)\cdot[\exp(-i2\pi v_1 t_1)+\exp(-i2\pi v_S t_1)]\cdot\sin(\pi J t_1)$ This generates one diagonal and one cross-peak signal for each spin, both antiphase with respect to the J-coupling.

REFERENCES

[1] M. Carravetta, O. G. Johannessen, and M. H. Levitt, Beyond the $T_1$ limit: Singlet nuclear spin states in low magnetic fields. Physical Review Letters 92 (2004) 153003-153004.

[2] M. Carravetta, and M. H. Levitt, Theory of long-lived nuclear spin states in solution nuclear magnetic resonance. I. Singlet states in low magnetic field. Journal of Chemical Physics 122 (2005) 214505-214506.

[3] S. Cavadini, J. Dittmer, S. Antonijevic, and G. Bodenhausen, Slow diffusion by singlet state NMR spectroscopy. Journal of the American Chemical Society 127 (2005) 15744-15748.

[4] M. Carravetta, and M. H. Levitt, Long-lived nuclear spin states in high-field solution NMR. Journal of the American Chemical Society 126 (2004) 6228-6229.

[5] K. Gopalakrishnan, and G. Bodenhausen, in preparation. (2006).

[6] M. Carravetta, X. Zhao, O. G. Johannessen, W. C. Lai, M. A. Verhoeven, P. H. M. Bovee-Geurts, P. J. E. Verdegem, S. Kiihne, H. Luthman, H. J. M. de Groot, W. J. deGrip, J. Lugtenburg, and M. H. Levitt, Protein-induced bonding perturbation of the rhodopsin chromophore detected by double-quantum solid-state NMR. Journal of the American Chemical Society 126 (2004) 3948-3953.

[7] P. Wenter, B. Furtig, A. Hainard, H. Schwalbe, and S. Pitsch, Kinetics of photoinduced RNA refolding by real-time NMR spectroscopy. Angewandte Chemie-International Edition 44 (2005) 2600-2603.

[8] P. Wenter, G. Bodenhausen, J. Dittmer, and S. Pitsch, Kinetics of RNA Refolding in Dynamic Equilibrium by $^1$H-Detected $^{15}$N Exchange NMR Spectroscopy. Journal of the American Chemical Society in press (2006).

[9] J. Jeener, B. H. Meier, P. Bachmann, and R. R. Ernst, Investigation of Exchange Processes by 2-Dimensional NMR Spectroscopy. Journal of Chemical Physics 71 (1979) 4546-4553.

[10] S. Macura, and R. R. Ernst, Elucidation of Cross Relaxation in Liquids by Two-Dimensional Nmr-Spectroscopy. Molecular Physics 41 (1980) 95-117.

[11] O. W. Sorensen, G. W. Eich, M. H. Levitt, G. Bodenhausen, and R. R. Ernst, Product Operator Formalism for the Description of Nmr Pulse Experiments. Progress in Nuclear Magnetic Resonance Spectroscopy 16 (1983) 163-192.

[12] M. J. Thrippleton, and J. Keeler, Elimination of zero-quantum interference in two-dimensional NMR spectra. Angewandte Chemie-International Edition 42 (2003) 3938-3941.

[13] K. E. Cano, M. J. Thrippleton, J. Keeler, and A. J. Shaka, Cascaded z-filters for efficient single-scan suppression of zero-quantum coherence. Journal of Magnetic Resonance 167 (2004) 291-297.

[14] A. J. Shaka, J. Keeler, T. Frenkiel, and R. Freeman, An Improved Sequence for Broad-Band Decoupling-Waltz-16. Journal of Magnetic Resonance 52 (1983) 335-338.

[15] P. Wenter, A. Peer, S. Pitsch, R. Sarkar, and G. Bodenhausen, in preparation.

[16] G. Wagner, G. Bodenhausen, N. Muller, M. Rance, O. W. Sorensen, R. R. Ernst, and K. Wuthrich, Exchange of 2-Spin Order in Nuclear Magnetic-Resonance—Separation of Exchange and Cross-Relaxation Processes. Journal of the American Chemical Society 107 (1985) 6440-6446.

We claim:

1. A nuclear magnetic resonance (NMR) method for singlet-state exchange NMR-spectroscopy, the method comprising the steps of:
    a) exciting single-quantum in-phase coherences;
    b) generating single-quantum anti-phase coherences;
    c) exciting zero-quantum coherences $ZQ_x$ and/or longitudinal two-spin order $2I_zS_z$ (="ZZ order") using a $\pi/4$ pulse;
    d) reversing a sign of the zero-quantum coherences $ZQ_x$ under an effect of a difference of chemical shifts of examined spins;
    e) transforming the zero-quantum coherences $ZQ_x$ and/or longitudinal two-spin ZZ order into singlet-state populations by means of RF irradiation during a mixing period $\tau_m$;
    f) reconverting the singlet-state populations remaining at an end of the mixing period $\tau_m$ into zero-quantum coherences $ZQ_x$ and/or ZZ order;
    g) reversing a sign of the zero-quantum coherences $ZQ_x$ under an effect of a difference of chemical shifts of examined spins; and
    h) reconverting zero-quantum coherences $ZQ_x$ and/or ZZ order into single-quantum anti-phase coherences.

2. The method of claim 1, wherein, subsequent to generation of single-quantum anti-phase coherences from zero-quantum coherences $ZQ_x$ and/or ZZ order, same are further transformed into in-phase coherences for detection during a subsequent step.

3. The method of claim 1, wherein a population of the singlet state is preserved by application of composite-pulse decoupling during the mixing period $\tau_m$.

4. The method of claim 1, wherein generation of single-quantum anti-phase coherences is carried out independently of a J-coupling constant during a $t_1$ evolution period of a two-dimensional (="2D") experiment by a choosing a maximum duration $t_1^{max}$ of the evolution period to achieve sufficient resolution for separation of signals in an $\omega_1$ domain to resolve anti-phase J-coupled multiplets.

5. The method of claim 1, wherein correlations between two or more sites are observed in which singlet-state populations can be excited and between which exchange of singlet-state populations occurs during a mixing period $\tau_m$ inserted after a $t_1$ evolution period and prior to a $t_2$ acquisition period in a 2D experiment.

6. The method of claim 1, wherein zero-quantum coherences $ZQ_x$ are suppressed by insertion of a first frequency-swept pulse and a first pulsed field gradient prior to the mixing period and insertion of a second frequency-swept pulse and a second pulsed field gradient after the mixing period, while preserving the ZZ coherence.

7. The method of claim 6, wherein intervals required for reversal of a sign of the zero-quantum coherences $ZQ_x$ according to steps d) and g) are removed.

* * * * *